(12) United States Patent
Matoba

(10) Patent No.: US 7,899,858 B2
(45) Date of Patent: Mar. 1, 2011

(54) FILTER CIRCUIT

(75) Inventor: Kenjirou Matoba, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 875 days.

(21) Appl. No.: 11/834,740

(22) Filed: Aug. 7, 2007

(65) Prior Publication Data

US 2008/0094119 A1  Apr. 24, 2008

(30) Foreign Application Priority Data

Oct. 20, 2006  (JP) ............................. 2006-285838

(51) Int. Cl.
*G06F 17/10* (2006.01)
(52) U.S. Cl. ...................................... 708/320; 708/316
(58) Field of Classification Search ................. 708/316, 708/320
See application file for complete search history.

(56) References Cited

U.S. PATENT DOCUMENTS 4,890,162 A * 12/1989 McNeely et al. ............ 708/320
5,777,911 A *  7/1998 Sherry et al. ................ 708/316

FOREIGN PATENT DOCUMENTS

JP        07-311082        11/1995

* cited by examiner

*Primary Examiner*—Tan V Mai
(74) *Attorney, Agent, or Firm*—Volentine & Whitt, PLLC

(57) ABSTRACT

The present invention provides a filter circuit which can eliminate single noise effectively and is relatively simple in circuit configuration. First and second absolute values of differences between one-clock-preceding output data and both of one-clock-preceding input data and two-clock-preceding input data are respectively calculated by subtracters. When the first absolute value<the second absolute value, a selector selects one-clock-preceding input data as the present output data. When the first absolute value≧the second absolute value, the selector selects two-clock-preceding input data as the present output data.

3 Claims, 7 Drawing Sheets

| SAMPLING | D_IN | S10 | D_OUT |
|---|---|---|---|
| ⋮ | ⋮ | ⋮ | ⋮ |
| SP1 | 0.038942 | 0.029552 | 0.019867 |
| SP2 | 0.047943 | 0.038942 | 0.029552 |
| SP3 | 0.056464 | 0.047943 | 0.038942 |
| SP4 | 0.5 | 0.056464 | 0.047943 |
| SP5 | 0.071736 | 0.5 | 0.056464 |
| SP6 | 0.078333 | 0.071736 | 0.071736 |
| SP7 | 0.084147 | 0.078333 | 0.071736 |
| SP8 | 0.089121 | 0.084147 | 0.078333 |
| SP9 | 0.093204 | 0.089121 | 0.084147 |
| ⋮ | ⋮ | ⋮ | ⋮ |
| SP10 | 0.08085 | 0.086321 | 0.09093 |
| SP11 | 0.074571 | 0.08085 | 0.086321 |
| SP12 | 0.067546 | 0.074571 | 0.08085 |
| SP13 | 0.059847 | 0.067546 | 0.074571 |
| SP14 | 0.05155 | 0.059847 | 0.067546 |
| SP15 | −0.5 | 0.05155 | 0.059847 |
| SP16 | 0.033499 | −0.5 | 0.05155 |
| SP17 | 0.023925 | 0.033499 | 0.033499 |
| SP18 | 0.014112 | 0.023925 | 0.033499 |
| SP19 | 0.004158 | 0.014112 | 0.023925 |
| SP20 | −0.00584 | 0.004158 | 0.014112 |
| SP21 | −0.01577 | −0.00584 | 0.004158 |
| ⋮ | ⋮ | ⋮ | ⋮ |

FIG. 3

| SAMPLING | D_IN | S10 | D_OUT |
|---|---|---|---|
| ⋮ | ⋮ | ⋮ | ⋮ |
| SP1 | 0.038942 | 0.029552 | 0.019867 |
| SP2 | 0.047943 | 0.038942 | 0.029552 |
| SP3 | 0.056464 | 0.047943 | 0.038942 |
| SP4 | 0.5 | 0.056464 | 0.047943 |
| SP5 | 0.071736 | 0.5 | 0.056464 |
| SP6 | 0.078333 | 0.071736 | 0.0641 |
| SP7 | 0.084147 | 0.078333 | 0.071736 |
| SP8 | 0.089121 | 0.084147 | 0.078333 |
| SP9 | 0.093204 | 0.089121 | 0.084147 |
| ⋮ | ⋮ | ⋮ | ⋮ |
| SP10 | 0.08085 | 0.086321 | 0.09093 |
| SP11 | 0.074571 | 0.08085 | 0.086321 |
| SP12 | 0.067546 | 0.074571 | 0.08085 |
| SP13 | 0.059847 | 0.067546 | 0.074571 |
| SP14 | 0.05155 | 0.059847 | 0.067546 |
| SP15 | -0.5 | 0.05155 | 0.059847 |
| SP16 | 0.033499 | -0.5 | 0.05155 |
| SP17 | 0.023925 | 0.033499 | 0.042524 |
| SP18 | 0.014112 | 0.023925 | 0.033499 |
| SP19 | 0.004158 | 0.014112 | 0.023925 |
| SP20 | -0.00584 | 0.004158 | 0.014112 |
| SP21 | -0.01577 | -0.00584 | 0.004158 |
| ⋮ | ⋮ | ⋮ | ⋮ |

FIG. 6

FILTER CIRCUIT

BACKGROUND OF THE INVENTION

The present invention relates to a filtering technique for eliminating noise superimposed on digital data.

Such a moving average process as applied to a rotating device disclosed in a patent document 1 (Japanese Unexamined Patent Publication No. Hei 7(1995)-311082 (description of noise eliminator in particular)) or a process using a digital filter has heretofore been performed in a filter circuit for eliminating noise superimposed on digital data.

In the filter circuit which performs the moving average process, however, when the type of noise is of single noise other than stationary noise, the result of average processing of samplings before and after the occurrence of noise deviates from a value to be outputted originally as the single noise becomes larger. On the other hand, since a filter circuit using a digital filter, e.g., an IIR (Infinite Impulse Response) filter generally needs a multiplier, a register and a cumulative adder, a circuit scale increases. There has thus been a demand for a filter circuit which can remove single noise effectively and is relatively easy in circuit configuration.

SUMMARY OF THE INVENTION

With the foregoing in view, it is an object of the present invention to provide a filter circuit which, eliminates single noise effectively and is relatively simple in circuit configuration.

According to one aspect of the present invention, for attaining the above object, there is provided a filter circuit which filters first data inputted thereto and thereby outputs second data and which comprises a first delayer, a first subtracter, a second subtracter, a comparator, a selector and a second delayer.

The first delay circuit operates at a timing of a predetermined clock and delays the first data inputted to the filter circuit by one clock. The first subtracter accepts feedback about second data and calculates a first difference value as an absolute value of a difference between the second data and the first data inputted to the filter circuit. The second subtracter receives feedback about the second data and calculates a second difference value as an absolute value of a difference between the second data and the first data delayed by the first delayer. The comparator compares the first difference value and the second difference value.

The selector selects and outputs the first data inputted to the filter circuit, based on the result of comparison by the comparator when the first difference value is smaller than the second difference value, and selects and outputs the first data delayed by the first delayer when the first difference value is greater than or equal to the second difference value. The second delayer operates at the timing of the predetermined clock and outputs the second data as data obtained by delaying the output data of the selector by one clock.

In the filter circuit of the present invention, the absolute values of differences between one-clock-preceding second data (fed-back output data of filter circuit), and both of one-clock-preceding first data (input data of filter circuit) and two-clock-preceding first data (first data delayed one clock by the first delayer) are respectively calculated by the first subtracter and the second subtracter. Then, the first difference value and the second difference value corresponding to the results of calculations by the first subtracter and the second subtracter are compared with each other. Either of first data (i.e., one-clock-preceding or two-clock-preceding first data) reduced in difference value is assumed to be the present second data (output data of filter circuit).

In the filter circuit of the present invention, when no noise is produced, the first data (input data of filter circuit) changes continuously and the first difference value becomes greater than or equal to the second difference value. Therefore, the two-clock-preceding first data is outputted as the second data as it is. When single noise corresponding to one clock (one sampling) occurs, the continuity of the first data is lost and the first difference value becomes smaller than the second difference value. Therefore, the one-clock-preceding first data is outputted as the second data. Accordingly, the single noise superimposed on the two-clock-preceding first data is not reflected on the present second data. That is, in the filter circuit of the present invention, the single noise is eliminated completely.

According to the filter circuit of the present invention, single noise can effectively be eliminated while a relatively easy circuit configuration is provided.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3 is a diagram showing changes in data in a second operation example of the filter circuit according to the first embodiment;

FIG. 6 is a diagram showing changes in data in an operation example of the filter circuit according to the second embodiment.

DETAILED DESCRIPTION OF THE PREFERRED EMBODIMENTS

Preferred embodiments of the present invention will hereinafter be described with reference to the accompanying drawings.

First Preferred Embodiment

Figure 1:
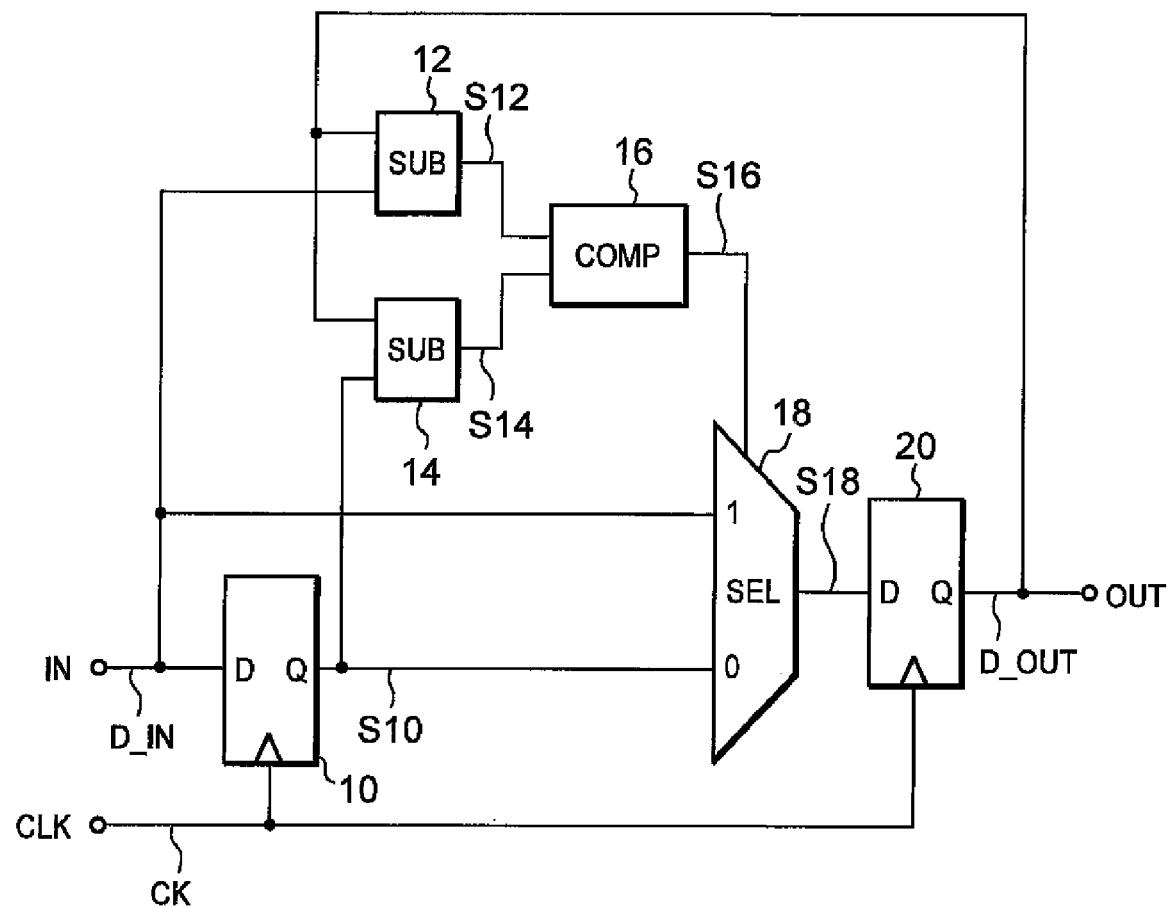
FIG. 1 is a circuit diagram of a filter circuit according to a first embodiment of the present invention.

One embodiment of a filter circuit according to the present invention will be explained below in conjunction with the accompanying drawings. FIG. 1 is a circuit diagram of the filter circuit 1 showing the present embodiment.

[Configuration of Filter Circuit 1]

A configuration of the filter circuit 1 will first be explained with reference to FIG. 1.

In the filter circuit 1, pre-filter data D_IN (first data) is inputted from an input terminal IN, and post-filter data D_OUT (second data) is outputted from an output terminal OUT. The filter circuit 1 is supplied with a clock signal CK corresponding to a sampling frequency of the data D_IN from outside through a clock terminal CLK.

A D terminal of a D flip-flop (first delayer) is connected to an input terminal IN. In the filter circuit 1, the D flip-flop 10 functions as a delayer which delays the data inputted from the D terminal by one clock and outputs the same from a Q terminal thereof.

A selector 18 is connected to the input terminal IN and the Q terminal of the D flip-flop 10. The selector 18 selects either of the input data D_IN of the filter circuit 1 or the output data S10 of the D flip-flop 10 depending on a logical level of data S16 and outputs the same as data S18.

A D terminal of a D flip-flop 20 (second delayer) is connected to an output terminal of the selector 18. In the filter circuit 1, the D flip-flop 20 functions as a delayer which delays the data S18 inputted from the D terminal by one clock and outputs the same from its Q terminal. An output terminal of the D flip-flop 20 is connected to an output terminal OUT. That is, the output of the D flip-flop 20 is output data D_OUT of the filter circuit 1.

A subtracter (SUB) 12 (first subtracter) outputs an absolute value corresponding to a difference between the two inputs. One of two input terminals of the subtracter 12 is connected to the input terminal IN. The other of the two input terminals of the subtracter 12 is connected to the output terminal OUT. The data D_OUT is fed back to the other thereof. Output data S12 of the subtracter 12 is supplied to a comparator 16.

A subtracter (SUB) 14 (second subtracter) outputs an absolute value corresponding to a difference between the two inputs. One of two input terminals of the subtracter 14 is connected to the Q terminal of the D flip-flop 10. The other of the two input terminals of the subtracter 12 is connected to the output terminal OUT. The data D_OUT is fed back to the other thereof. Output data S14 of the subtracter 14 is supplied to the comparator 16.

The comparator (COMP) 16 compares the data S12 and the data S14. When the data S12 is smaller than the data S14, the comparator 16 outputs a logical level "1" as data S16. When the data S12 is greater than or equal to the data S14, the comparator 16 outputs a logical level "0" as data S16. As mentioned above, the selector 18 performs a selecting process, based on the data S16. That is, when the logical level of the data S16 is "1", the selector 18 selects the data D_IN. When the logical level of the data S16 is "0", the selector 18 selects the data S10.

[Operation of Filter Circuit 1]

The operation of the filter circuit 1 according to the present embodiment will next be explained.

In the filter circuit 1, the output data S10 of the D flip-flop 10 is brought to data delayed one clock with respect to the input data D_IN of the filter circuit 1. The output data D_OUT of the D flip-flop 10 is brought to data delayed one clock with respect to the output data S18 of the selector 18. The data D_OUT is fed back to the subtracters 12 and 14. Thus, assuming that, for example, input data preceding input data D_IN(N) at some point in time by one clock is represented as D_IN(N−1), input data preceding the input data D_IN(N) by two clocks is represented as D_IN(N−2), . . . , output data D_OUT(N) at some point in time can be represented as shown in the following (1) and (2).

$$\text{When } |D\_OUT(N-1) - D\_IN(N-1)| < |D\_OUT(N-1) - D\_IN(N-2)| \text{ is established, } D\_OUT(N) = D\_IN(N-1). \quad (1)$$

$$\text{When } |D\_OUT(N-1) - D\_IN(N-1)| \geq |D\_OUT(N-1) - D\_IN(N-2)| \text{ is established, } D\_OUT(N) = D\_IN(N-2). \quad (2)$$

That is, the absolute value of a difference between one-clock-old or -preceding output data and one-clock-old or -preceding input data and the absolute value of a difference between the one-clock-preceding output data and two-clock-preceding input data are compared with each other in the filter circuit 1. Either of the input data (one-clock-preceding one or two-clock-preceding one) made small in the difference absolute value is defined as the present output data. When no noise is produced, i.e., the input data changes continuously, the above-described condition of (2) is always established. Therefore, the filter circuit 1 outputs the two-clock-old or preceding input data as it is. On the other hand, when single noise equivalent to one sampling is produced, i.e., the continuity of input data is lost, the above-described condition of (1) is established. Thus, input data after one clock from the single noise, i.e., one-clock-preceding input data is outputted. Therefore, the single noise is completely eliminated in the filter circuit 1.

First Operation Example

A first operation example of the filter circuit 1 will be explained below with reference to FIG. 2.

Figure 2:
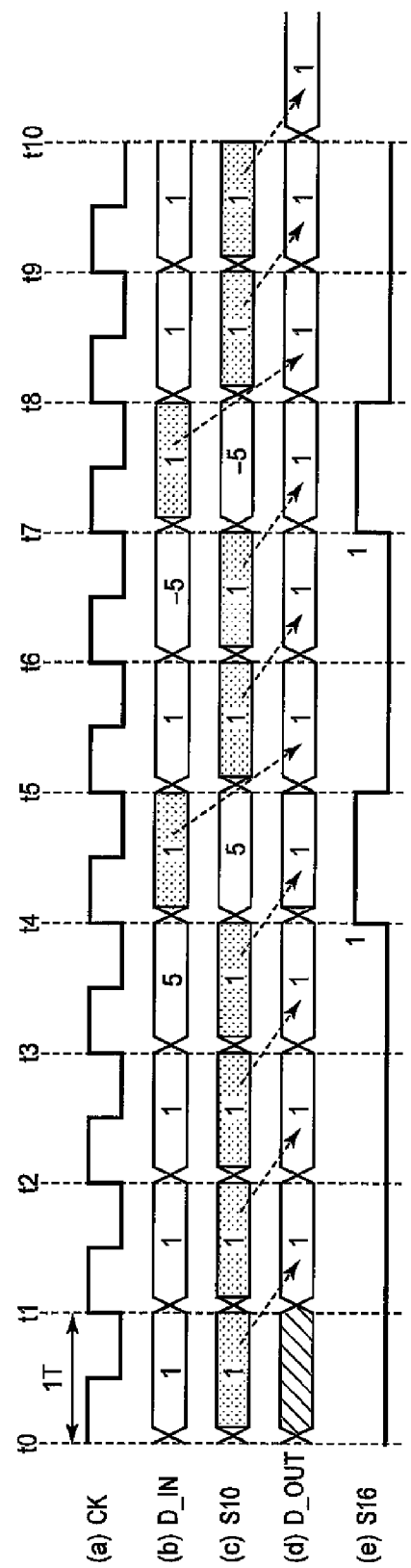
FIG. 2 is a timing chart for describing a first operation example of the filter circuit according to the first embodiment.

FIG. 2 is a timing chart for describing the first operation example. FIGS. 2(a), 2(b), 2(c), 2(d) and 2(e) show the clock signal CK, input data D_IN of the filter circuit 1, output data S10 of the D flip-flop 10, output data D_OUT of the filter circuit 1, and output data S16 of the comparator 16, respectively. In FIG. 2, a period or interval from a time to a time t1, a period from the time t1 to a time t2, . . . , and a period from a time t9 to a time t10 are all indicative of a clock cycle or period 1T. The value of one-clock-preceding input data D_IN is outputted as the output data S10 of the D flip-flop 10.

In the first operation example, the original values of the input data D_IN are all "1". During the period from the times t3 to t4 and the period from the times t6 to t7, the single noise (corresponding to each of data "5" and data "−5") is superimposed on the input data D_IN.

When the present values of the respective periods from the times t0 to t5 are expressed in "N" in the present operation example, D_OUT(N−1)=1, D_IN(N−1)=1 and D_IN(N−2)=1. Therefore, |D_OUT(N−1)−D_IN(N−1)|≧|D_OUT(N−1)−D_IN(N−2)| is established, and hence the output data S16 of the comparator 16 remains "0" up to the time t4. And the output D_OUT results in one-clock-preceding data S10, i.e., two-clock-preceding input data D_IN (refer to arrows shown in FIG. 2).

On the other hand, when the single nose is superimposed on the input data D_IN during the period from the times t3 to t4, the output data S16 of the comparator 16 changes from "0" to "1" due to the single noise during the period from the times t4 to t5. That is, since D_OUT(N−1)=1, D_IN(N−1)=1 and D_IN(N−2)=5 when the present value of the period from the times t5 to t6 is expressed in "N", |D_OUT(N−1)−D_IN(N−1)|<|D_OUT(N−1)−D_IN(N−2)| is established. And the output D_OUT corresponding to the period from the times t5 to t6 results in one-clock-preceding input data D_IN (refer to arrow in FIG. 2).

Thereafter, the output D_OUT is brought to one-clock-preceding input data D_IN similarly even where another single noise is superimposed on the corresponding input data D_IN during the period from the times t6 to t7.

As a result, the output data D_OUT assumes data (all are data of "1") free of superimposition of noise thereon as shown in FIG. 2(d) in the first operation example.

Second Operation Example

Figure 4:
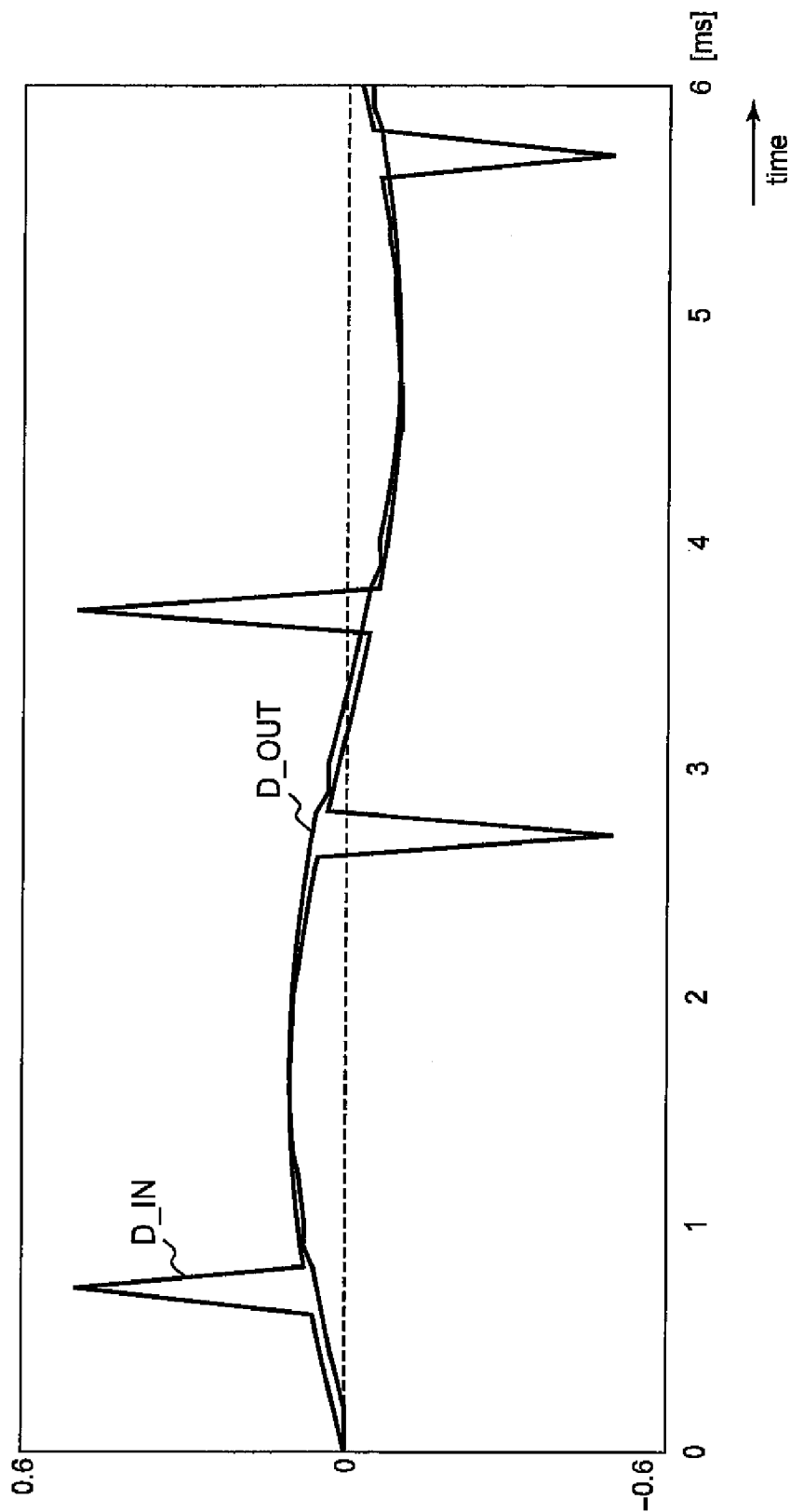
FIG. 4 is a waveform diagram illustrating changes in input/output data in the second operation example of the filter circuit according to the first embodiment.

A second operation example of the filter circuit 1 will be explained below with reference to FIGS. 3 and 4. The second operation example shows an example in which single noise is superimposed on sinusoidal input data D_IN. FIG. 3 is a diagram showing the values of input data D_IN, output data S10 of D flip-flop 10 and output data D_OUT at timings (SP1, SP2, . . . ) provided for respective samplings each synchronized with the clock signal CK. FIG. 4 is a waveform diagram showing the values of the respective data in FIG. 3. The sinusoidal wave is, for example, data whose period or cycle is 6 ms and whose amplitude is 0.1. Single noise is superimposed on the input data D_IN corresponding to such a sinusoidal wave at the samplings SP4 and SP15 (values thereof are expressed as "0.5" and "−0.5").

In the second operation example, the output data D_OUT at timings free of superimposition of single noise, e.g., the timings provided for the samplings SP1 through SP5 result in one-clock-preceding data S10, i.e., two-clock-preceding input data D_IN as shown in FIG. 3.

On the other hand, when noise overlaps the input data D_IN at the timing provided for the sampling SP4, the output data D_OUT results in one-clock-preceding input data D_IN at the timing provided for the sampling SP6 two clock ahead of the sampling SP4. Therefore, the noise of the input data D_IN at the timing provided for the sampling SP4 is not reflected on the output data D_OUT at the timing provided for the sampling SP6. The noise having overlapped the input data D_IN at the timing provided for the sampling SP15 is also unreflected on the output data D_OUT at the timing provided for the sampling SP17 in like manner. Accordingly, the output data D_OUT assumes a sine wave with no noise superimposed thereon as shown in FIG. 4.

According to the filter circuit 1 of the present embodiment as described above, when the two-clock-preceding input data is not recognized as noise, the filter circuit 1 outputs the two-clock-preceding input data as it is. When the two-clock-preceding input data is recognized as noise, the filter circuit 1 outputs the input data after one clock from the single noise, i.e., one-clock-preceding input data. Accordingly, the single noise is completely eliminated in the present filter circuit 1.

Second Preferred Embodiment

Another embodiment of a filter circuit of the present invention will be explained below in connection with the accompanying drawings.

Since the filter circuit 1 according to the first embodiment outputs one-clock-preceding input data as it is when the single noise is produced as described above, the single noise is completely removed. There is, however, a case in which the output data does not change smoothly before and after the timing at which the single noise occurs. When, for example, noise overlaps ever-changing input data, e.g., noise is superimposed on the sinusoidal input data as shown in the second operation example of the first embodiment, the output data located before and after the generation timing provided for the noise do not change smoothly. The present embodiment will explain the filter circuit in which this point has been improved.

[Configuration of Filter Circuit 2]

Figure 5:
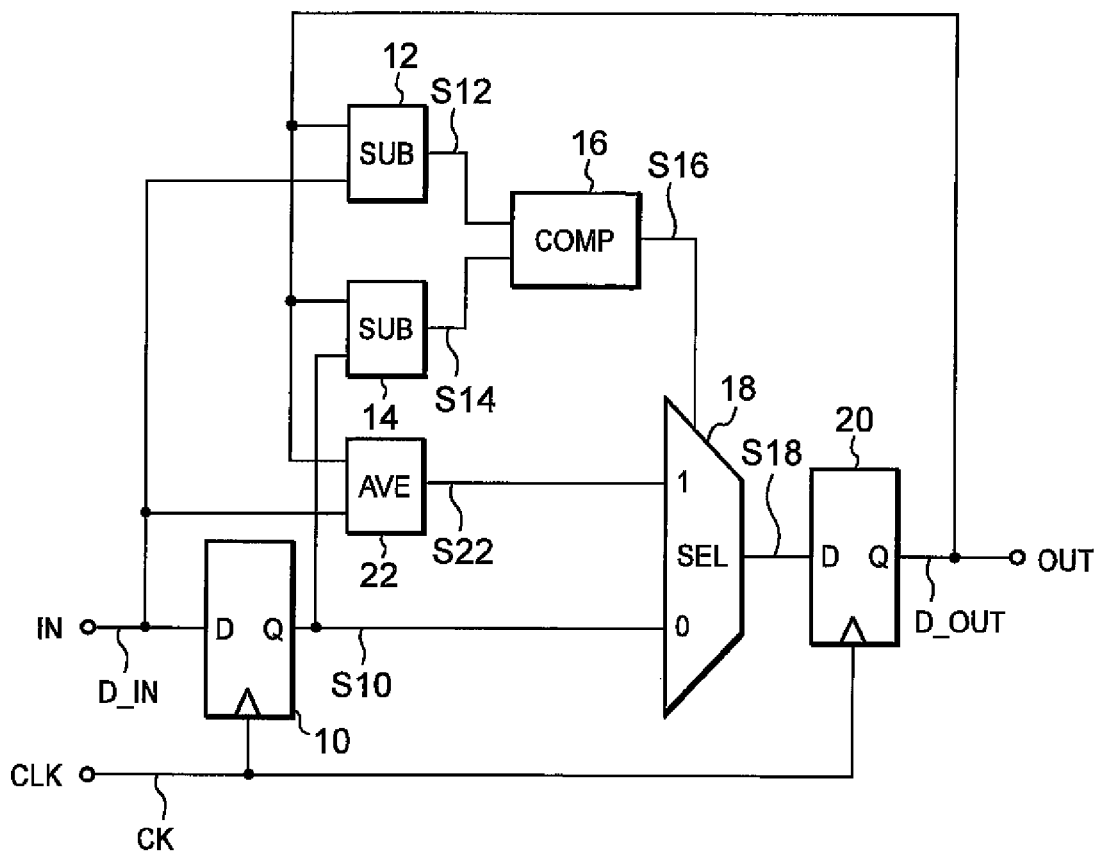
FIG. 5 is a circuit diagram of a filter circuit according to a second embodiment of the present invention.

A configuration of a filter circuit 2 will first be described with reference to FIG. 5. FIG. 5 is a circuit diagram of the filter circuit 2 of the present embodiment. Incidentally, in FIG. 5, the same symbols are attached to the same components or portions as those in the filter circuit 1 shown in FIG. 1, and their dual explanations will therefore be omitted.

The filter circuit 2 of the present embodiment includes an average computing or arithmetic unit (AVE) 22 added to the above filter circuit 1 as an intermediate data computing or arithmetic unit. The average arithmetic unit 22 calculates the average value of two input data and outputs the same as data S22. One of two input terminals of the average arithmetic unit 22 is connected to an input terminal IN. The other of the two input terminals of the average arithmetic unit 22 is connected to an output terminal OUT. Data D_OUT is fed back to the other of the two input terminals thereof.

[Operation of Filter Circuit 2]

The operation of the filter circuit 2 of the present embodiment will next be explained.

In the filter circuit 2, data S10 outputted from a D flip-flop 10 is brought to data delayed one clock with respect to input data D_IN of the filter circuit 2. The output data D_OUT of the D flip-flop 10 is brought to data delayed one clock with respect to data S18 outputted from a selector 18. The data D_OUT is fed back to subtracters 12 and 14 and the average arithmetic unit 22. Thus, assuming that, for example, input data preceding input data D_IN(N) at some point in time by one clock is represented as D_IN(N−1), input data preceding the input data D_IN(N) by two clocks is represented as D_IN(N−2), . . . , output data D_OUT(N) at some point in time can be represented as expressed in the following (1) and (2).

When $|D\_OUT(N-1)-D\_IN(N-1)| < |D\_OUT(N-1)-D\_IN(N-2)|$ is established, $D\_OUT(N) = (D\_IN(N-1) + D\_OUT(N-1))/2$. (1)

When $|D\_OUT(N-1)-D\_IN(N-1)| \geq |D\_OUT(N-1)-D\_IN(N-2)|$ is established, $D\_OUT(N) = D\_IN(N-2)$. (2)

That is, the absolute value of a difference between one-clock-old or -preceding output data and one-clock-old or -preceding input data and the absolute value of a difference between the one-clock-preceding output data and two-clock-preceding input data are compared with each other in the filter circuit 2. When the former difference absolute value is greater than or equal to the latter difference absolute value, the two-clock-preceding input data is taken as the present output data. On the other hand, when the former difference absolute value is smaller than the latter difference absolute value, the average value of the one-clock-preceding input data and the one-clock-preceding output data is taken as the present output data.

Thus, when no noise occurs, the filter circuit 2 outputs the two-clock-preceding input data as it is (refer to the above (2)). When single noise corresponding to one sampling is produced, the filter circuit 2 outputs the average value of input data after one clock from the single noise, i.e., one-clock-preceding input data and one-clock-preceding output data (refer to the above (1)). Therefore, in the filter circuit 2, the single noise is completely eliminated and the output data prior and subsequent to the generation of the noise change smoothly.

Operation Example

Figure 7:
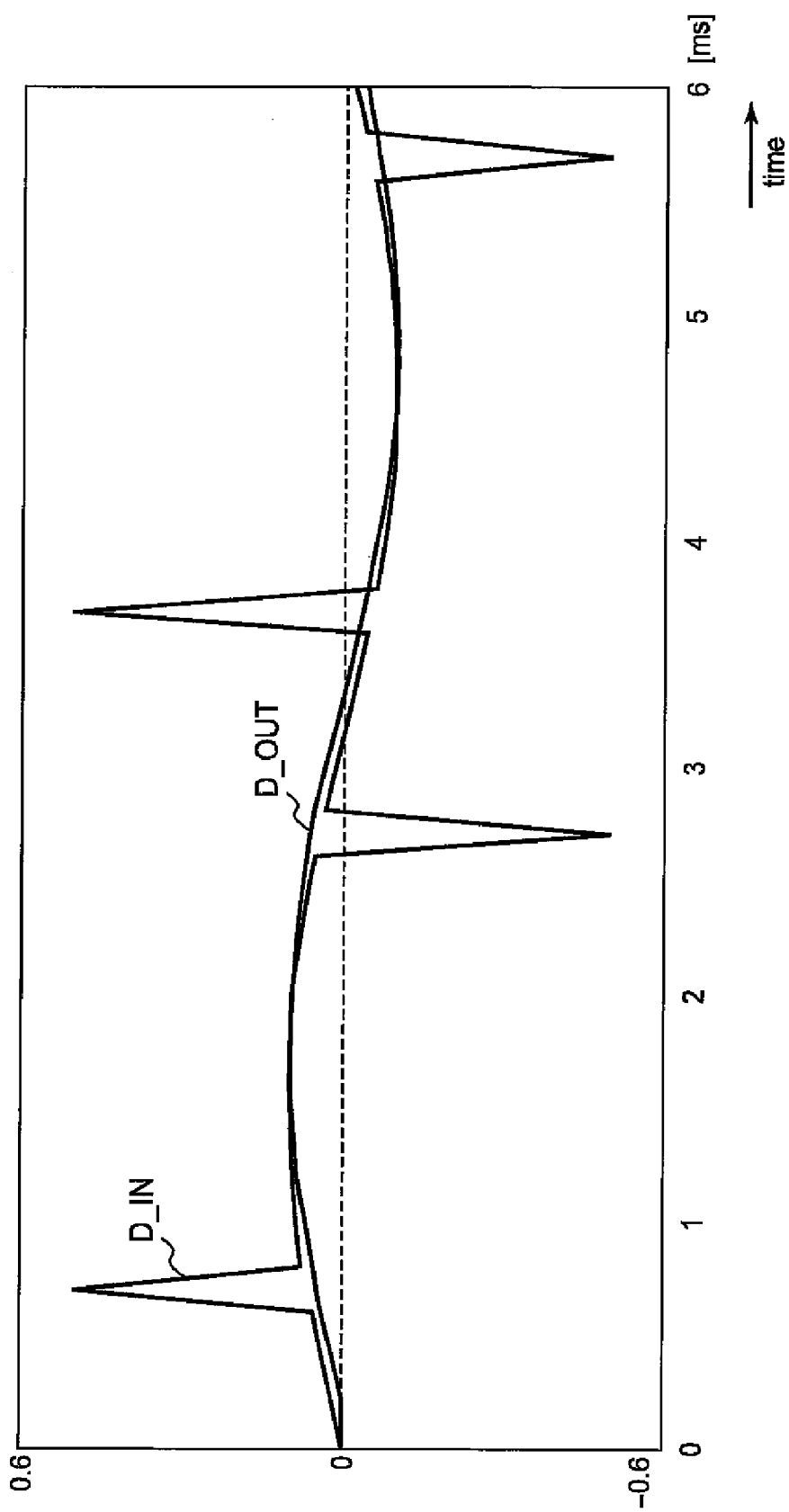
FIG. 7 is a waveform diagram illustrating changes in input/output data in the operation example of the filter circuit according to the second embodiment.

An operation example of the filter circuit 2 will be explained below with reference to FIGS. 6 and 7. The operation example shows an example in which single noise is superimposed on sinusoidal input data D_IN. FIG. 6 is a diagram showing the values of input data D_IN, output data S10 of D flip-flop 10 and output data D_OUT at respective samplings (SP1, SP2, . . . ). FIG. 7 is a waveform diagram showing the values of the respective data in FIG. 6. The sinusoidal wave is the same as the second operation example (refer to FIG. 4) of the first embodiment as shown in FIG. 7. That is, single noise is superimposed on the sinusoidal input data D_IN whose period or cycle is 6 ms and whose amplitude is 0.1, at each of the samplings SP4 and SP 15 (values thereof are expressed as "0.5" and "−0.5").

In the operation example, the output data D_OUT at timings free of superimposition of single noise, e.g., the timings provided for the samplings SP1 through SP5 result in one-clock-preceding data S10, i.e., two-clock-preceding input data D_IN as shown in FIG. 6.

On the other hand, when noise overlaps the corresponding input data D_IN at the timing provided for the sampling SP4, the output data D_OUT results in the average (=0.0641) of one-clock-preceding input data D_IN (=0.071736) and one-clock-preceding output data D_OUT (=0.056464) at the timing provided for the sampling SP6 two clock ahead of the sampling SP4. Therefore, the noise of the input data D_IN at the timing provided for the sampling SP4 is not reflected on the output data D_OUT of the filter circuit 2, and the output data D_OUT (samplings SP5 through SP7) before and after it change smoothly. This is similar to the above even where noise is superimposed on the input data D_IN at the timing provided for the sampling SP15.

As a result, the waveform of the output data D_OUT shown in FIG. 7 rather than the waveform of the output data D_OUT of the second operation example (refer to FIG. 4) according to the first embodiment becomes smooth before and after the generation of the noise in particular.

As described above, the filter circuit 2 of the present embodiment is different from that of the first embodiment in that while the absolute value of the difference between the one-clock-preceding output data and the one-clock-preceding input data, and the absolute value of the difference between the one-clock-preceding output data and the two-clock-preceding input data are compared with each other in a manner similar to the first embodiment, the average of the one-clock-preceding input data and the one-clock-preceding output data is taken as the present output data when the former difference absolute value is smaller than the latter difference absolute value. Thus, in the filter circuit 2, the single noise is completely removed and the output data before and after the generation of the noise change smoothly. Consequently, the filter circuit 2 is particularly effective where noise overlaps the ever-changing input data.

While the preferred embodiments of the present invention have been described above in detail, the specific configuration and system are not limited to the present embodiments. Changes in the design in the range departing from the gist of the present invention, adaptation to other systems, and the like are also contained.

Although the average arithmetic unit 22 for calculating the average value of the two input data is provided in the second embodiment, for example, the present invention is not limited to the calculation of the average value. Taking an intermediate value between one-clock-preceding input data and one-clock-preceding output data can yield the effect that output data before and after noise generation change smoothly in like manner. Since, however, the configuration of the filter circuit becomes the simplest, the average arithmetic unit 22 may preferably be applied thereto.

What is claimed is:

1. A filter circuit which inputs first data therein, filters the first data and outputs the so-processed first data as second data, comprising:
    a first delayer which operates at a timing of a predetermined clock and delays the first data inputted to the filter circuit by one clock;
    a first subtracter to which the second data is fed back and which calculates a first difference value as an absolute value of a difference between the second data and the first data inputted to the filter circuit;
    a second subtracter to which the second data is fed back and which calculates a second difference value as an absolute value of a difference between the second data and the first data delayed by the first delayer;
    a comparator which compares the first difference value and the second difference value;
    a selector which selects and outputs the first data inputted to the filter circuit, based on the result of comparison by the comparator when the first difference value is smaller than the second difference value, and selects and outputs the first data delayed by the first delayer when the first difference value is greater than or equal to the second difference value; and
    a second delayer which operates at the timing of the predetermined clock and outputs the second data as data obtained by delaying the output data of the selector by one clock.

2. The filter circuit according to claim 1, further comprising an intermediate data arithmetic unit to which the second data is fed back and which calculates intermediate data between the second data and the first data inputted to the filter circuit, wherein the selector selects and outputs the intermediate data when the first difference value is smaller than the second difference value.

3. The filter circuit according to claim 2, wherein the intermediate data is data corresponding to an average of the fed-back second data and the first data inputted to the filter circuit.

* * * * *